(12) United States Patent
Lam

(10) Patent No.: US 7,927,918 B2
(45) Date of Patent: Apr. 19, 2011

(54) PACKAGED PRODUCTS, INCLUDING STACKED PACKAGE MODULES, AND METHODS OF FORMING SAME

(75) Inventor: Ken M. Lam, Colorado Springs, CO (US)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 12/479,407

(22) Filed: Jun. 5, 2009

(65) Prior Publication Data

US 2009/0302449 A1 Dec. 10, 2009

Related U.S. Application Data

(60) Division of application No. 11/557,879, filed on Nov. 8, 2006, now Pat. No. 7,564,137, which is a continuation-in-part of application No. 11/380,477, filed on Apr. 27, 2006, now abandoned.

(51) Int. Cl.
*H01L 21/48* (2006.01)
*H01L 21/50* (2006.01)
*H01L 23/02* (2006.01)
*H01L 21/44* (2006.01)
*H01L 23/34* (2006.01)
*H01L 29/40* (2006.01)
*H01L 23/48* (2006.01)
*H01L 23/62* (2006.01)

(52) U.S. Cl. .............. 438/109; 438/125; 257/E25.027; 257/773; 257/723; 257/686

(58) Field of Classification Search .......... 438/109, 438/125; 257/773, 723, 686
See application file for complete search history.

(56) References Cited

U.S. PATENT DOCUMENTS

| | | | |
|---|---|---|---|
| 5,585,675 A | 12/1996 | Knopf | |
| 5,744,827 A | 4/1998 | Jeong et al. | |
| 6,038,133 A | 3/2000 | Nakatani et al. | |
| 6,294,407 B1 | 9/2001 | Jacobs | |
| 6,320,251 B1 | 11/2001 | Glenn | |
| 6,414,391 B1 | 7/2002 | Corisis et al. | |
| 6,489,676 B2 | 12/2002 | Taniguchi et al. | |
| 6,563,217 B2 | 5/2003 | Corisis et al. | |

(Continued)

FOREIGN PATENT DOCUMENTS

WO WO-2007127739 A2 11/2007
(Continued)

OTHER PUBLICATIONS

"U.S. Appl. No. 11/380,477, Non-Final Office Action mailed Feb. 12, 2008", 10 pgs.

(Continued)

*Primary Examiner* — David A Zarneke
(74) *Attorney, Agent, or Firm* — Schwegman, Lundberg & Woessner, P.A.

(57) ABSTRACT

An apparatus and a method for packaging semiconductor devices. The apparatus is a three-dimensional electronic package comprising one or more electronic components, a plurality of electrical contact pads, and a plurality of electrically conductive three-dimensional plugs formed through an encapsulant. Specific ones of the plurality of electrical contact pads are electrically coupled to the one or more electronic components on an uppermost surface of the plurality of electrical contact pads. The encapsulant is formed over and covers the one or more electronic devices. The plurality of three-dimensional plugs have a first end extending from at least the uppermost portion of one or more of the plurality of electrical contact pads and a second end extending substantially to an uppermost surface of the encapsulant.

21 Claims, 4 Drawing Sheets

U.S. PATENT DOCUMENTS

| | | |
|---|---|---|
| 6,613,606 B1 | 9/2003 | Lee |
| 6,674,159 B1 | 1/2004 | Peterson et al. |
| 6,740,964 B2 | 5/2004 | Sasaki |
| 6,784,530 B2 | 8/2004 | Sugaya et al. |
| 6,838,768 B2 | 1/2005 | Corisis et al. |
| 7,034,386 B2 | 4/2006 | Kurita |
| 7,242,081 B1 | 7/2007 | Lee |
| 7,564,137 B2 | 7/2009 | Lam |
| 7,791,206 B2 | 9/2010 | Takeuchi et al. |
| 2002/0125571 A1 | 9/2002 | Corisis et al. |
| 2003/0038378 A1 | 2/2003 | Jacobs |
| 2003/0197271 A1 | 10/2003 | Corisis et al. |
| 2005/0006768 A1 | 1/2005 | Narasimhan et al. |
| 2005/0035357 A1 | 2/2005 | Fjelstad |
| 2005/0067680 A1 | 3/2005 | Boon et al. |
| 2005/0110135 A1 | 5/2005 | Corisis et al. |
| 2005/0218499 A1 | 10/2005 | Chang et al. |
| 2006/0022332 A1 | 2/2006 | Koyama et al. |
| 2006/0027908 A1 | 2/2006 | Chang et al. |
| 2007/0252255 A1 | 11/2007 | Lam |
| 2007/0262435 A1 | 11/2007 | Lam |
| 2010/0172113 A1 | 7/2010 | Lam |

FOREIGN PATENT DOCUMENTS

| | | |
|---|---|---|
| WO | WO-2008/057739 A2 | 5/2008 |

OTHER PUBLICATIONS

"U.S. Appl. No. 11/380,477, Final Office Action mailed on Mar. 10, 2009", 8 pgs.

"U.S. Appl. No. 11/380,477, Non-Final Office Action mailed Aug. 6, 2009", 8 pgs.

"U.S. Appl. No. 11/380,477, Amendment and Response filed May 12, 2008 to Non-Final Office Action mailed Feb. 12, 2008", 15 pgs.

"U.S. Appl. No. 11/380,477, Response filed Sep. 22, 2008 to Restriction Requirement mailed Aug. 22, 2008", 11 pgs.

"U.S. Appl. No. 11/380,477, Response filed Jul. 10, 2009 to Final Office Action mailed Mar. 10, 2009", 12 pgs.

"U.S. Appl. No. 11/380,477, Restriction Requirement mailed Aug. 22, 2008", 4 pgs.

"U.S. Appl. No. 11/557,879, Notice of Allowance mailed Apr. 7, 2009", 8 pgs.

"U.S. Appl. No. 11/557,879, Amendment and Response filed May 13, 2008 to Non-Final Office Action mailed Feb. 13, 2008", 18 pgs.

"U.S. Appl. No. 11/557,879, Advisory Action mailed Mar. 6, 2009", 3 pgs.

"U.S. Appl. No. 11/557,879, Non-Final Office Action mailed Feb. 13, 2008", 7 pgs.

"U.S. Appl. No. 11/557,879, Amendment Under 37 C.F.R. § 1.312 filed Jun. 4, 2009", 8 pgs.

"U.S. Appl. No. 11/557,879, Response filed Feb. 19, 2009 to Final Office Action mailed Nov. 19, 2008", 13 pgs.

"U.S. Appl. No. 11/557,879, Final Office Action mailed Nov. 19, 2008", 7 pgs.

"U.S. Appl. No. 11/557,879, Response filed Sep. 22, 2008 to Restriction Requirement mailed Aug. 22, 2008", 12 pgs.

"U.S. Appl. No. 11/557,879, Restriction Requirement mailed Aug. 22, 2008", 5 pgs.

"International Application No. PCT/US07/67315, International Search Report mailed Mar. 21, 2008", 2 pgs.

"International Application No. PCT/US07/67315, Written Opinion mailed Mar. 21, 2008", 4 pgs.

"International Application No. PCT/US07/82002, International Search Report mailed Apr. 25, 2008", 2 pgs.

"International Application No. PCT/US07/82002, Written Opinion mailed Apr. 25, 2008", 6 pgs.

"Chinese Application Serial No. 200780014844.X Office Action Dec. 18, 2009", 8.

"U.S. Appl. No. 11/557,879, Amendment filed Jun. 4, 2009 as a Response to the Notice of Allowance mailed Apr. 7, 2009", 8 pgs.

"U.S. Appl. No. 11/557,879, Response to Rule 312 Communication mailed Jun. 18, 2009", 2 pgs.

"Chinese Application Serial No. 200780014844.X, First Office Action Dec. 18, 2009", (w/ English Translation), 15 pgs.

"Chinese Application Serial No. 200780014844.X, Response filed Apr. 16, 2010 to First Office Action Dec. 18, 2009", (w' English Translation), 14 pgs.

"International Application Serial No. PCT/US07/67315, International Preliminary Report on Patentability mailed Aug. 12, 2008", 5 pgs.

"U.S. Appl. No. 12/683,357, Non Final Office Action mailed Dec. 27, 2010", 8 pgs.

"U.S. Appl. No. 12/683,357, Response filed Feb. 1, 2011 to Non Final Office Action mailed Dec. 27, 2010", 8 pgs.

PACKAGED PRODUCTS, INCLUDING STACKED PACKAGE MODULES, AND METHODS OF FORMING SAME

CROSS-REFERENCE TO RELATED APPLICATION

This application is a divisional of U.S. patent application Ser. No. 11/557,879, filed Nov. 8, 2006, now U.S. Pat. No. 7,564,137 entitled, "STACKABLE INTEGRATED CIRCUIT STRUCTURES AND SYSTEMS, DEVICES AND METHODS RELATED THERETO," which is a continuation-in-part of U.S. patent application Ser. No. 11/380,477, entitled "THREE-DIMENSIONAL PACKAGING SCHEME FOR PACKAGE TYPES UTILIZING A SACRIFICIAL METAL BASE," filed Apr. 27, 2006 now abandoned.

TECHNICAL FIELD

The invention relates to a three-dimensional stackable semiconductor package, and more particularly, to a three-dimensional stackable semiconductor package for package types having a sacrificial metal base.

BACKGROUND

As semiconductor integrated circuit chips become more multi-functional and highly integrated, the chips include more bonding pads (or terminal pads), and thus packages for the chips have more external terminals (or leads). When a conventional plastic package that has its leads along the perimeter of the package must accommodate a large number of leads, the footprint of the package increases. However, a goal in many electronic systems is to minimize an overall size of the systems. Thus, to accommodate a large number of pins without increasing the footprint of package, pin pitch (or lead pitch) of the package must decrease. However, a pin pitch of less than about 0.4 mm gives rise to many technical concerns. For example, trimming of a package having a pin pitch less than 0.4 mm requires expensive trimming tools, and the leads are prone to bending during handling of the package. In addition, surface-mounting of such packages demands a costly and complicated surface-mounting process due to a required critical alignment step.

Thus, to avoid technical problems associated with conventional fine-pitch packages, packages that have area array external terminals have been suggested. Among these packages are ball grid array packages and chip scale packages. The semiconductor industry presently uses a number of chip scale packages. A micro ball grid array package (μBGA) and a bump chip carrier (BCC) are examples of the chip scale packages. The μBGA package includes a polyimide tape on which a conductive pattern is formed and employs a totally different manufacturing process from a conventional plastic packaging. The bump chip carrier package includes a substrate having grooves formed around a central portion of a top surface of a copper alloy plate and an electroplating layer formed in the grooves. Accordingly, chip scale packages use specialized packaging materials and processes that increase package manufacturing costs.

FIGS. 1A through 1C illustrate plan and cross-sectional views of a conventional apparatus for manufacturing leadless BCC packages. With reference to the plan view of FIG. 1A, a conventional metal carrier matrix array 101 has an upper surface 103, which includes an encapsulating matrix 105 with a plurality of sawing lines 107.

The cross-sectional view of FIG. 1B includes a plurality of bump pads 109 and a plurality of die pads 111 formed on the upper surface 103 (FIG. 1A) of the metal carrier 101 by plating. Back surfaces of integrated circuit dice 113 are attached to corresponding die pads 111, and a plurality of bonding wires 115 connect a plurality of bonding pads 117 on active surfaces of the dice 113 to corresponding bump pads 109. An encapsulant 119 encapsulates the encapsulating matrix 105 including the dice 113 and the bonding wires 115.

With reference to the underside plan view of FIG. 1C, after etching away the metal carrier 101 (not shown in FIG. 1C), the bump pads 109 and the die pads 111 are exposed from the bottom surface 121 of the encapsulant 119. Then, the encapsulant 119 is singulated by sawing along the sawing lines 107 to form a plurality of individual BCC packages.

Therefore, an integrated circuit package that uses conventional packaging materials and processes can only be accessed for electrical interconnection, for example, to a printed circuit board, by the bump pads on the bottom surface 121 of the package.

SUMMARY

In one embodiment, a higher density of integrated circuit packaging into a given printed circuit board footprint is provided as a means of allowing the integrated circuit packages to be stacked, one atop another. In an exemplary embodiment, the present invention is a three-dimensional electronic package comprising one or more electronic components, a plurality of electrical contact pads, and a plurality of electrically conductive three-dimensional plugs formed through an encapsulant. Specific ones of the plurality of electrical contact pads are electrically coupled to the one or more electronic components on an uppermost surface of the plurality of electrical contact pads. The encapsulant is formed over and covers the one or more electronic devices. The plurality of three-dimensional plugs have a first end extending from at least the uppermost portion of one or more of the plurality of electrical contact pads and a second end extending substantially to an uppermost surface of the encapsulant.

In another exemplary embodiment, the present invention is a method of packaging a semiconductor device. The method includes forming a plurality of electrical contact pads over a sacrificial base strip, mounting an electrical component to select ones of the plurality of electrical contact pads, forming an encapsulant over the electrical component, forming a plurality of holes from an uppermost portion of the encapsulant to at least an uppermost portion of one or more of the plurality of electrical contact pads, and at least partially filling the plurality of holes with an electrically conductive material. The holes are at least partially-filled such that the at least partially-filled plurality of holes is electrically conductive from a first end in electrical contact with the one or more of the plurality of electrical contact pads to a second end which is substantially coplanar with an uppermost surface of the encapsulant.

In another exemplary embodiment, the present invention is a method of producing a three-dimensional package for mounting a plurality of electronic devices. The method includes forming a plurality of electrical contact pads over a sacrificial base strip, mounting the plurality of electronic devices to select ones of the plurality of electrical contact pads, attaching a plurality of bond wires from select ones of the plurality of electronic devices to select ones of the plurality of electrical contact pads, forming an encapsulant over the plurality of electronic devices, forming a plurality of holes from an uppermost portion of the encapsulant to at least an uppermost portion of one or more of the plurality of electrical contact pads, and at least partially filling the plurality of holes with an electrically conductive material. The holes are at least partially-filled such that the at least partially-filled plurality of holes is electrically conductive from a first end in electrical contact with the one or more of the plurality of electrical contact pads to a second end which is substantially coplanar with an uppermost surface of the encapsulant. The sacrificial base strip is removed after the encapsulant is formed over the plurality of electronic devices.

DETAILED DESCRIPTION

Various common package types which utilize a sacrificial metal base strip connection do not have electrical connection pads on an uppermost surface of the completed package. Package types in this category include thin array plastic package (TAPP), ultra-thin land grid array (ULGA), and bumped chip carrier (BCC) packages. However, an application of the present invention to each of these and other packages allows packages to be arranged in three-dimensional stacks. Three-dimensional stacks allow a much smaller footprint of electronic devices when compared with a similar density of non-stacked devices. Further, individual packages may be individually tested prior to stacked packages being electrically connected thus improving final package test yield when compared with prior art non-stacked techniques. Additionally, rework of a stacked package module is possible simply by replacing components within the stack. Under the prior art, if one component in a package fails the entire package must be replaced. Utilizing the present invention, only one package within the stack is replaced.

TAPP, ULGA, BCC, and similar families of packages are manufactured in multi-strip formats throughout an assembly process and then singulated into individual packages as a final step. Illustrations used herein focus on a single unit merely for clarity. However, a skilled artisan will recognize application of the present invention to a multi-strip application as well.

Figure 1A:
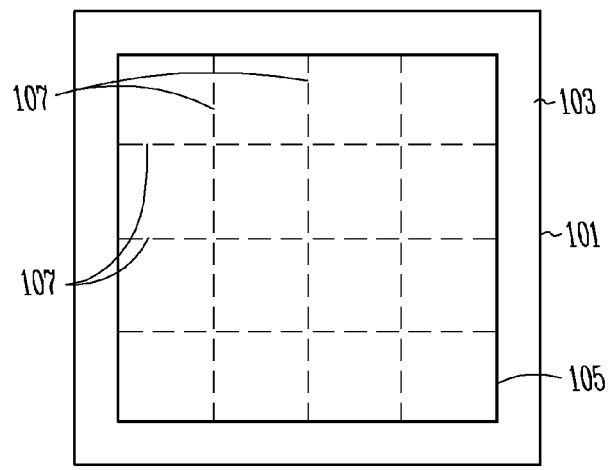
FIGS. 1A-1C show a bumped chip carrier (BCC) of the prior art.
Figure 1B:
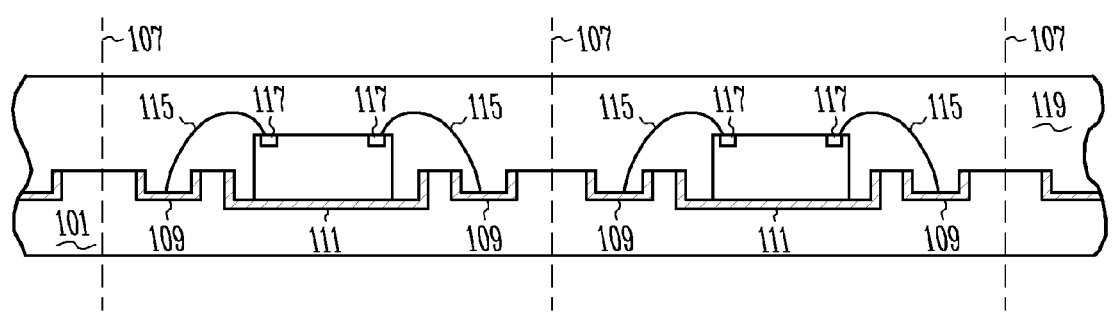
Figure 1C:
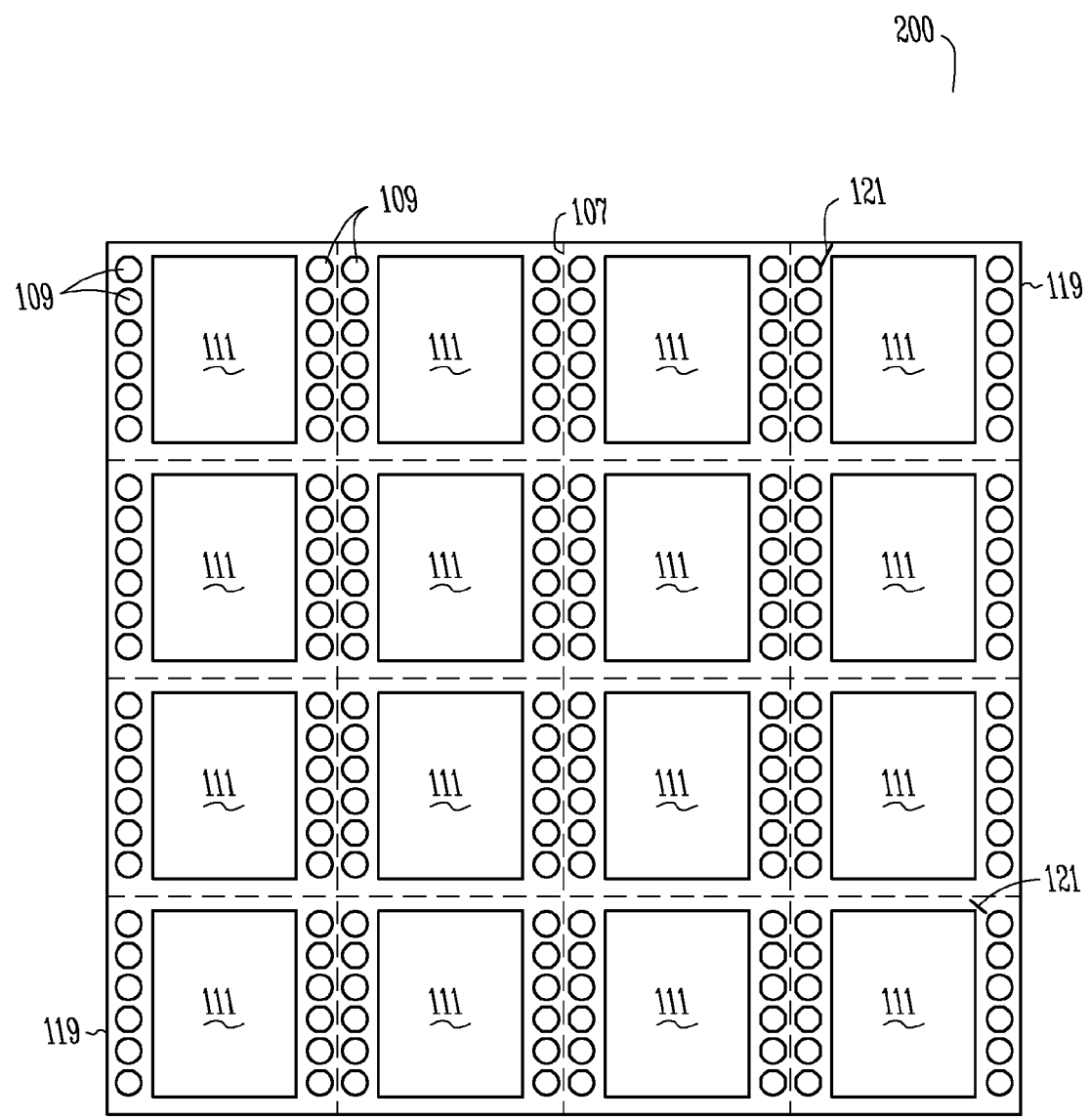
Figure 2A:
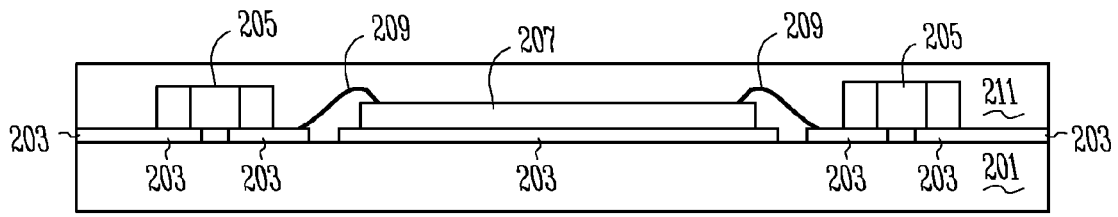
FIGS. 2A-2D show cross-sectional views of exemplary fabrication steps of the present invention at a post-encapsulation phase.

With reference to FIG. 2A, a sacrificial metal-type package is shown after components are mounted and encapsulated. Specifically, the exemplary package of FIG. 2 includes a sacrificial base strip 201, a plurality of attach/bond pads 203, a plurality of discrete devices 205, an integrated circuit device 207, a plurality of bond wires 209, and an encapsulant (i.e., mold compound) 211. Any number and combination of integrated circuit dice and/or discrete components may be mixed in the package. In addition to using bond wires 209, the dice may be, for example, flip-chip bonded and either mounted as a single die or in a stacked-die configuration. The sacrificial base strip 201 may be comprised of copper, copper alloys, or other types of materials such as nickel or iron and its alloys. In an alternative embodiment, the sacrificial base strip 201 may be formed from a non-conducting material.

The plurality of attach/bond pads 203 may be plated-up metal layers. One desirable key property of the attach/bond pads 203 is to support a solder attach assembly for the package external connection pads and to support wire-bonding and/or flip-chip solder bonding and discrete component solder attach. There are situations where other electrical attachment techniques may not require solder attachment and thus the ability to solder to the attach/bond pads 203 is not an issue. For example, certain types of electrically-conductive epoxies will not require solder attachments. In any case, an ability to carry electrical current may be another parameter in determining a composition of the plated-up metal layers. Such determinations are known to one of skill in the art. However, typical metal layer compositions of the plated-up layer include, for example, gold-nickel-copper-nickel-gold (Au—Ni—Cu—Ni—Au) and gold-palladium-nickel-palladium (Au—Pd—Ni—Pd).

Figure 2B:
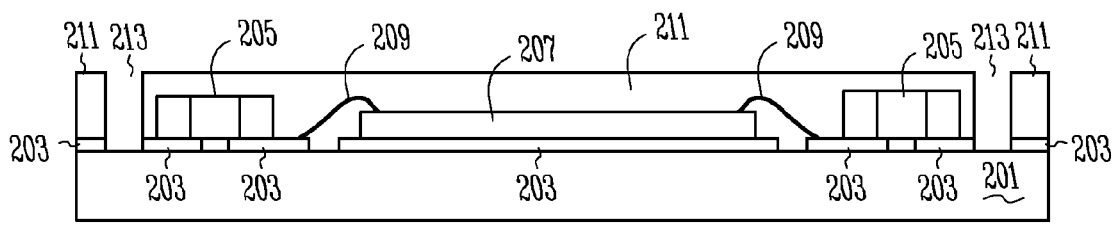

In FIG. 2B, holes (e.g., tunnels or vias) 213 are formed in the encapsulant 211 at one or more points where electrical connections need to be brought from a lowermost portion of the package to an uppermost portion of the package. The holes 213 may be produced by, for example, laser drilling or mechanical drilling through the encapsulant 211. Other techniques may also be used to form the holes 213. Alternative forms of producing the holes 213 include incorporating pins into the encapsulant 211 prior to curing the mold compound or an anisotropic chemical etch (depending upon chemical characteristics of a material chosen for the encapsulant 211). The holes 213 thus expose the electrically conductive surfaces of one or more of the attach/bond pads 203. The holes 213 may either be formed to an uppermost surface of the attach/bond pads 203 or, alternatively, may be drilled past the attach/bond pads and into the sacrificial base strip 201.

Figure 2C:
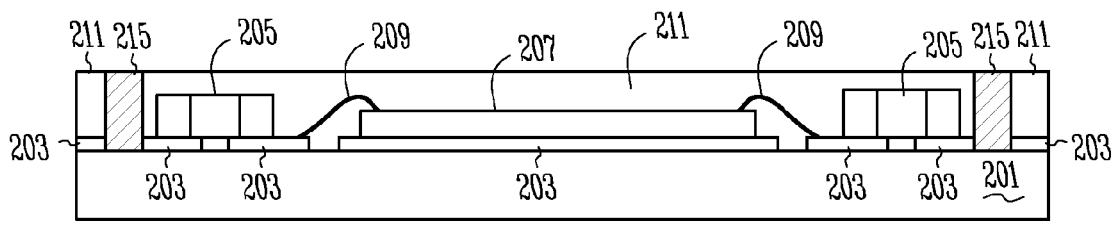

In FIG. 2C, the holes 213 (FIG. 2B) are at least partially-filled (e.g., filled sufficiently to provide a complete electrical path from the lowermost surface, i.e., the contact pads, to the uppermost surface that is substantially coplanar with the top surface of the encapsulant) with an electrically conductive material. A partial filling is electrically conductive from the lowermost surface to the uppermost surface and may be physically discontinuous in all areas (e.g., a cylindrical shape). The electrically conductive material thus forms a three-dimensional plug 215. The three-dimensional plug 215 may be formed by, for example, an electrolytic copper plating. Metals or alloys other than copper may be used as well. Such metals include copper alloys, nickel, tin, tin alloys, tungsten, titanium-tungsten, and so on. Further, forming methods other than electrolytic plating may be used including physical or chemical vapor deposition (PVD or CVD).

Figure 2D:
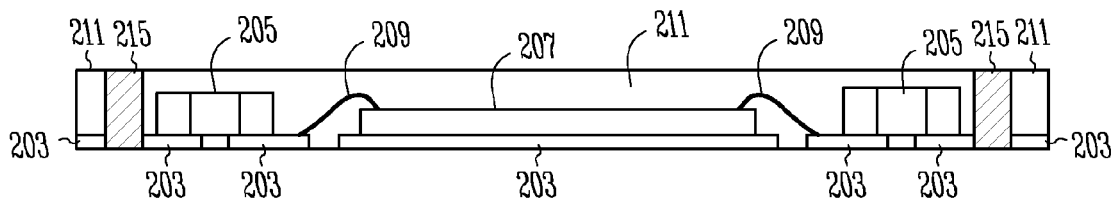

In FIG. 2D, the sacrificial base strip 201 is removed, for example, by chemical etching. Using a high-selectivity etchant, the etchant will not etch any of the plated-up metal layers, which form the plurality of attach/bond pads 203 or the electrically conductive plug 215. In an alternative embodiment, if the sacrificial base strip 201 is formed from a non-conductive material, the sacrificial base strip 201 may be left in place. The multi-strip format (not shown) is singulated (typically by mechanical sawing or laser-scribing), forming individual packages having electrical connection pads on both an uppermost and a lowermost surface. The packages may be stacked and electrically collected, one atop another.

Figure 3A:
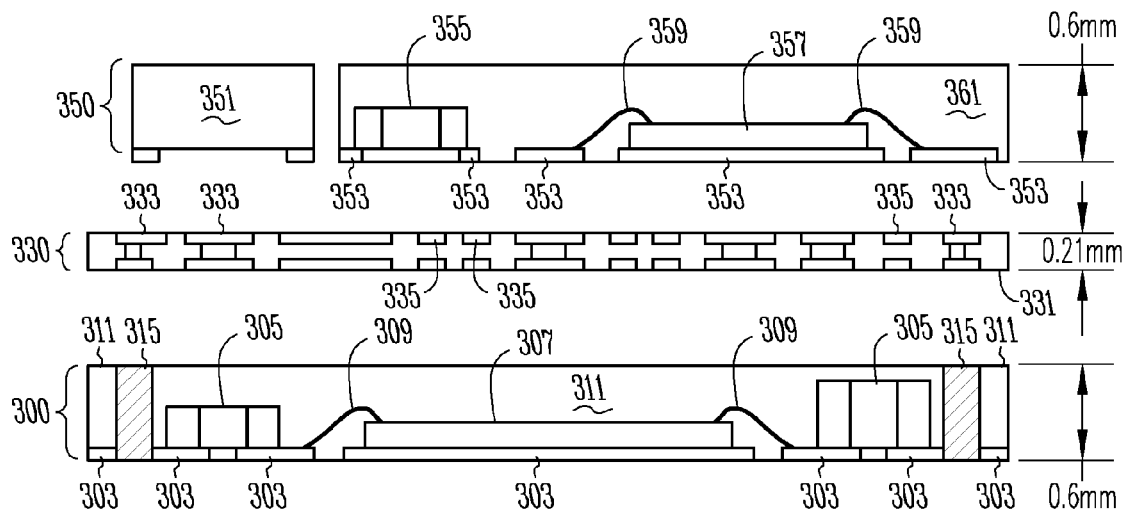
FIGS. 3A-3C show exemplary applications in embodiments of the present invention.

With reference to FIG. 3A, an exemplary application of the present invention is shown in use with other electronic devices. Three major components are a multi-component package 300 in accordance with the present invention, a four-layer thin core substrate 330, and a system-in-package (SIP) module 350.

In this exemplary application, the multi-component module 300 includes a plurality of attach/bond pads 303, a plurality of discrete electronic devices 305, an integrated circuit 307, a plurality of bond wires 309, and encapsulant 311, and a plurality of three-dimensional plugs 315. The four-layer thin core substrate 330 is known in the art and includes a core 331, a plurality of feed-through connectors 333, and a plurality of contact pads 335. The core is typically an epoxy laminate (e.g., FR-4) or ceramic. The SIP module 350 includes an externally-mounted crystal 351, a plurality of attach/bond pads 353, one or more internally-mounted discrete electronic devices 355, an integrated circuit device 357, a plurality of bond wires 359, and an encapsulant 361. The encapsulated package within the SIP module 350 may be virtually an type of electronic package including a BGA, quad flat-pack no-lead (QFN), quad flat package (QFP), and so on.

Figure 3B:
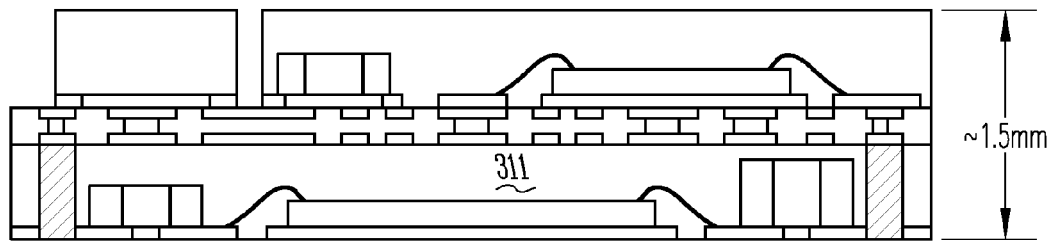
Figure 3C:
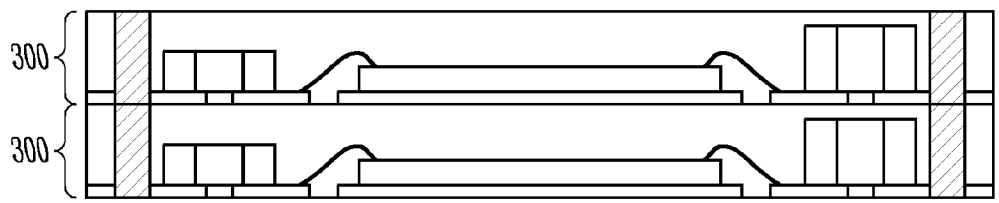

FIG. 3B shows a final three-dimensional package 390 made possible through the use of the multi-component module 300 of the present invention. A skilled artisan will recognize that a plurality of multi-component modules 300 (FIG. 3A), in this and other configurations, may be stacked in numerous ways. (See, for example, FIG. 3C). All dimensions shown in FIGS. 3A and 3B are merely exemplary and are based on thicknesses of many standard components.

In the foregoing specification, the present invention has been described with reference to specific embodiments thereof. It will, however, be evident to a skilled artisan that various modifications and changes can be made thereto without departing from the broader spirit and scope of the invention as set forth in the appended claims. For example, skilled artisans will appreciate that embodiments of the present invention may be readily applied to modified versions of TAPP (thin array plastic package), ULGA (ultra-thin land grid array), BCC (bumped chip carrier), or other package types. The specification and drawings are, accordingly, to be regarded in an illustrative rather than a restrictive sense.

What is claimed is:

1. A method of forming a packaged product, comprising:
   forming a sacrificial base strip;
   forming a plurality of electrical contact pads over the sacrificial base strip;
   mounting an electrical component to select ones of the plurality of electrical contact pads;
   forming an encapsulant over the electrical component;
   forming a plurality of holes from an uppermost portion of the encapsulant through the one or more of the plurality of electrical contact pads; and
   at least partially filling the plurality of holes with an electrically conductive material.

2. The method of claim 1 wherein the at least partially-filled plurality of holes is electrically conductive from a first end in electrical contact with the one or more of the plurality of electrical contact pads, to a second end, which is substantially coplanar with an uppermost surface of the encapsulant, wherein the packaged product is formed.

3. The method of claim 1, further comprising attaching a plurality of bond wires from the electrical component to select ones of the plurality of electrical contact pads.

4. The method of claim 1 wherein the electrically conductive material is copper.

5. The method of claim 1, further comprising removing the sacrificial base strip after the encapsulant is formed over the electronic component.

6. The method of claim 5, wherein the sacrificial base strip is removed by chemical etching.

7. The method of claim 6, wherein the etchant chemically etches only the sacrificial base strip.

8. The method of claim 1, wherein the plurality of electrical contact pads are formed from a plated-up metal layer.

9. The method of claim 8, wherein the plated-up metal layer is a gold-nickel composite.

10. The method of claim 1, further comprising bonding a flip chip or mounting a single die to the packaged product.

11. The method of claim 1, wherein the packaged product is an integrated circuit structure.

12. A packaged product produced according to the method of claim 1.

13. The method of claim 1, further comprising stacking two or more packaged products on top of one another to form a stacked package module.

14. The method of claim 13, further comprising electrically connecting components in the stacked package module.

15. The method of claim 13, further comprising testing individual packaged products prior to stacking.

16. The method of claim 14, further comprising replacing one or more packaged products within the stacked package module.

17. The method of claim 13 wherein the stacked package module is a thin array plastic package (TAPP).

18. The method of claim 13 wherein the stacked packaged modules is an ultra-thin land grid array (ULGA).

19. The method of claim 13 wherein the stacked package module is a bumped chip carrier (BCC).

20. A packaged product produced according to the method of claim 13.

21. A packaged product produced according to the method of claim 16.

* * * * *

UNITED STATES PATENT AND TRADEMARK OFFICE
CERTIFICATE OF CORRECTION

| | | |
|---|---|---|
| PATENT NO. | : 7,927,918 B2 | Page 1 of 1 |
| APPLICATION NO. | : 12/479407 | |
| DATED | : April 19, 2011 | |
| INVENTOR(S) | : Ken M. Lam | |

It is certified that error appears in the above-identified patent and that said Letters Patent is hereby corrected as shown below:

Column 4, Line 57; replace:
"may be stacked and electrically collected, one atop another" with
-- may be stacked and electrically connected, one atop another --

Signed and Sealed this
Fifteenth Day of January, 2013

David J. Kappos
*Director of the United States Patent and Trademark Office*